(12) United States Patent
Vyvoda et al.

(10) Patent No.: US 7,018,878 B2
(45) Date of Patent: Mar. 28, 2006

(54) METAL STRUCTURES FOR INTEGRATED CIRCUITS AND METHODS FOR MAKING THE SAME

(75) Inventors: Michael A. Vyvoda, Fremont, CA (US); Steven J. Radigan, Fremont, CA (US); K. Leo Zhang, Shanghai (CN)

(73) Assignee: Matrix Semiconductor, Inc., Santa Clara, CA (US)

( * ) Notice: Subject to any disclaimer, the term of this patent is extended or adjusted under 35 U.S.C. 154(b) by 636 days.

(21) Appl. No.: 10/045,653

(22) Filed: Nov. 7, 2001

(65) Prior Publication Data

US 2003/0087484 A1 May 8, 2003

(51) Int. Cl.
*H01L 21/336* (2006.01)
(52) U.S. Cl. ...................... 438/197; 438/597
(58) Field of Classification Search ............... 438/197, 438/597, 669, 626, 240
See application file for complete search history.

(56) References Cited

U.S. PATENT DOCUMENTS

| | | | |
|---|---|---|---|
| 4,811,082 A | 3/1989 | Jacobs et al. | |
| 5,160,987 A | 11/1992 | Pricer et al. | |
| 5,191,405 A | 3/1993 | Tomita et al. | |
| 5,426,566 A | 6/1995 | Beilstein, Jr. et al. | |
| 5,801,437 A | 9/1998 | Burns | |
| 5,950,107 A | 9/1999 | Huff et al. | |
| 5,985,693 A | 11/1999 | Leedy | |
| 6,184,118 B1 | 2/2001 | Chung et al. | |
| 6,627,939 B1* | 9/2003 | Yamaguchi | 257/301 |
| 6,635,851 B1* | 10/2003 | Uhl | 219/270 |
| 6,645,851 B1* | 11/2003 | Ho et al. | 438/626 |
| 6,649,465 B1* | 11/2003 | Iijima et al. | 438/240 |

FOREIGN PATENT DOCUMENTS

EP 0 395 886 A2 11/1990

OTHER PUBLICATIONS

Brian Dipert, "Exotic Memories, Diverse Approaches", Edn Asia, Sep. 2001, 22-33.

* cited by examiner

*Primary Examiner*—Howard Weiss
*Assistant Examiner*—(Vikki)Hoa B. Trinh
(74) *Attorney, Agent, or Firm*—Pamela J. Squyres

(57) ABSTRACT

Metal structures for ICs and methods for manufacturing the same are described. The metal structures range from small features to large features and are resistant to peeling problems during heat treatments that occur during the manufacturing process. Peeling of the metal structures from the underlying structures or substrates is reduced or prevented. The peeling problems are reduced or prevented by including a capping layer or capping structure over the dielectric layer over the metal structure and then annealing the capping layer or capping structure, thereby enhancing the adhesion of the metal structure to the underlying structure or substrate.

12 Claims, 4 Drawing Sheets

METAL STRUCTURES FOR INTEGRATED CIRCUITS AND METHODS FOR MAKING THE SAME

FIELD OF THE INVENTION

The invention generally relates to methods for fabricating integrated circuits (ICs) and semiconductor devices and the resulting structures. More particularly, the invention relates to metal structures used in ICs and methods for making such structures. Even more particularly, the invention relates to IC metal structures protected from and resistant to peeling and methods for making such structures.

BACKGROUND OF THE INVENTION

In IC fabrication, metal structures and metal layers are used extensively as conducting paths in the circuit. Indeed, multiple levels of metal layers (above an underlying substrate) are typically employed when manufacturing the IC. The multiple metal layers are employed in order to accommodate higher densities, allowing device dimensions to shrink well below one micron. Thus, ICs having three and four levels (and more) of metallization are becoming more prevalent as device geometries shrink to sub-micron levels.

One common metal used for forming such metal layers (also referred to as metal lines or metal wiring) is Tungsten (W). Tungsten is also used as a material for forming interconnections in vias to connect the different metal layers. The size (e.g., width) of the tungsten structures typically ranges from "large" structures (with the smallest dimension greater than about 1 microns) to "small" structures (with the smallest dimension less than about 0.25 microns). As the size of ICs decrease, even smaller metal structures will necessarily be used.

As with other IC fabrication methods, devices containing metal structures are often subjected to heat treatments. Such heat treatments can often cause problems with the metal structures. See, for example, U.S. Pat. No. 6,184,118, the disclosure of which is incorporated herein by reference. In particular, tungsten structures can often "peel" during heat treatments and especially during aggressive heat treatments, e.g., those lasting for about 1 minute at a temperature of about 800° C. When the tungsten structures delaminate or peel, they can cause electrical failure in that wafer die where the peeling occurs. As well, such peeling can also cause high defect densities in adjacent dies on the wafer since the peeled metal can move to adjacent dies. Finally, such peeling can contaminate fabrication equipment, resulting in widespread defect problems.

To overcome this problem, many manufacturers employ very strict topological design requirements, even if they do not use aggressive heat treatments. For example, some manufacturers will not make tungsten structures with dimensions greater than 1 micron because of the problems noted above. Without larger tungsten structures, many IC devices can be limited in their features and functionality. For example, slotting or waffling techniques are often used to meet maximum size requirements while providing wider (lower resistance) metal lines. Such techniques, however, can make the total size of high-current-carrying structures, such as bus lines, larger than if no slotting was needed. Also, it is often difficult to use such techniques within areas of the wafer having irregular circuit features.

SUMMARY OF THE INVENTION

The present invention provides metal structures for ICs and methods for manufacturing the same. The metal structures range from small features to large features and withstand peeling problems during heat treatments that occur during the manufacturing process. The invention is able to reduce or prevent peeling of the metal structures from the underlying structures or substrates. The peeling problems are reduced or prevented by including a capping layer or capping structure over the dielectric layer over the metal structure and then annealing the capping layer or capping structure, thereby enhancing the adhesion of the metal structure to the underlying structure or substrate.

BRIEF DESCRIPTION OF THE DRAWINGS

FIGS. 1–5, 6a, 6b, 6c, 6d, and 7 are views of one aspect of the IC metal structures and methods of making the same according to the invention, in which:

FIGS. 1 and 2 illustrate various substrates on which the metal structures of the invention can be formed;

FIGS. 3–5 illustrate the sequence of steps in one aspect of process of the invention;

FIGS. 6a, 6b, 6c, and 6d illustrate the various configurations of the capping structure of the invention; and FIG. 7 illustrates the sequence of steps in one aspect of process of the invention;

FIGS. 1–5, 6a, 6b, 6c, 6d, and 7 presented in conjunction with this description are views of only particular—rather than complete—portions of the IC metal structures and methods of making the same according to the invention.

DETAILED DESCRIPTION OF THE INVENTION

The following description provides specific details in order to provide a thorough understanding of the present invention. The skilled artisan, however, would understand that the present invention can be practiced without employing these specific details. Indeed, the present invention can be practiced by modifying the illustrated structure and method, and can be used in conjunction with apparatus and techniques conventionally used in the industry. For example, while the invention is described with reference to IC devices, it could be modified for other devices that require metal structures such as MEMS devices. As well, the invention is described with reference to tungsten metal structures, but could be used for other refractory metals (and their alloys) like cobalt, refractory metal suicides such as $TiSi_2$, or other non-refractory metals (or their alloys) like aluminum, as well as other metals that delaminate under heat treatments.

Figure 1:
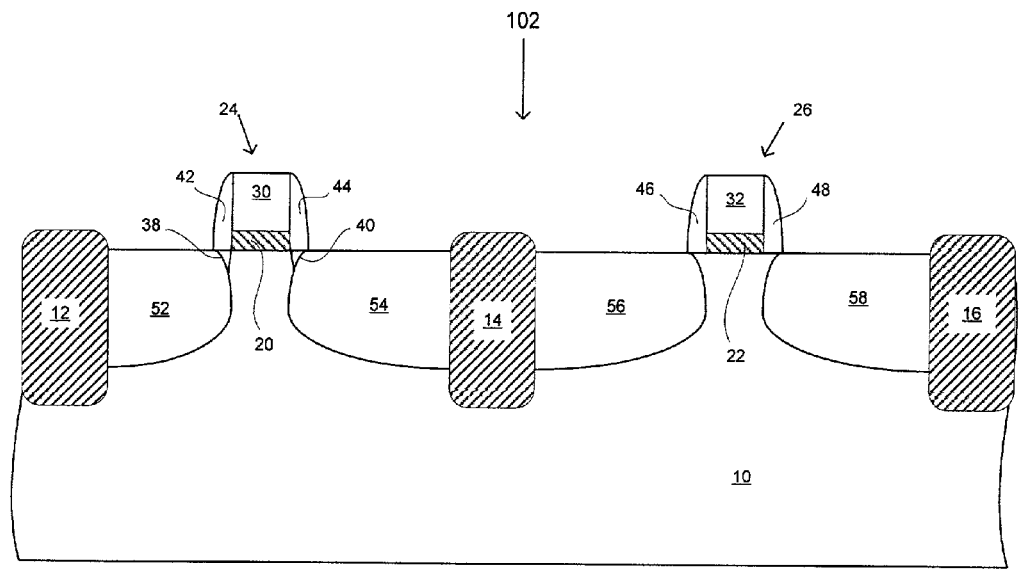

As illustrated in FIG. 1, the process of the invention begins with a substrate. The substrate can be any suitable substrate (or surface) known in the art on which a metal structure can be formed. Example of such substrates include a metal structure like a metal interconnect in a via, a pre-formed portion (or section) of an IC device like a CMOS substrate, or a dielectric layer. In a preferred aspect of the invention, a CMOS substrate 102 (similar to that illustrated in FIG. 1) is employed as the substrate used in the invention. CMOS substrate 102 contains those portions of an IC device which, when combined with the overlying metallization as well as additional components, will form a CMOS device. Examples of such components (as illustrated in FIG. 1) include: wafer 10; field oxide regions 12, 14, and 16; gate regions 24 and 26 containing gates 30 and 32, gate oxides 20 and 22, sidewall spacers 42, 44, 46, and 48; source regions 52 and 56; drain regions 54 and 58; and source-drain extension regions 38 and 40.

Figure 2:
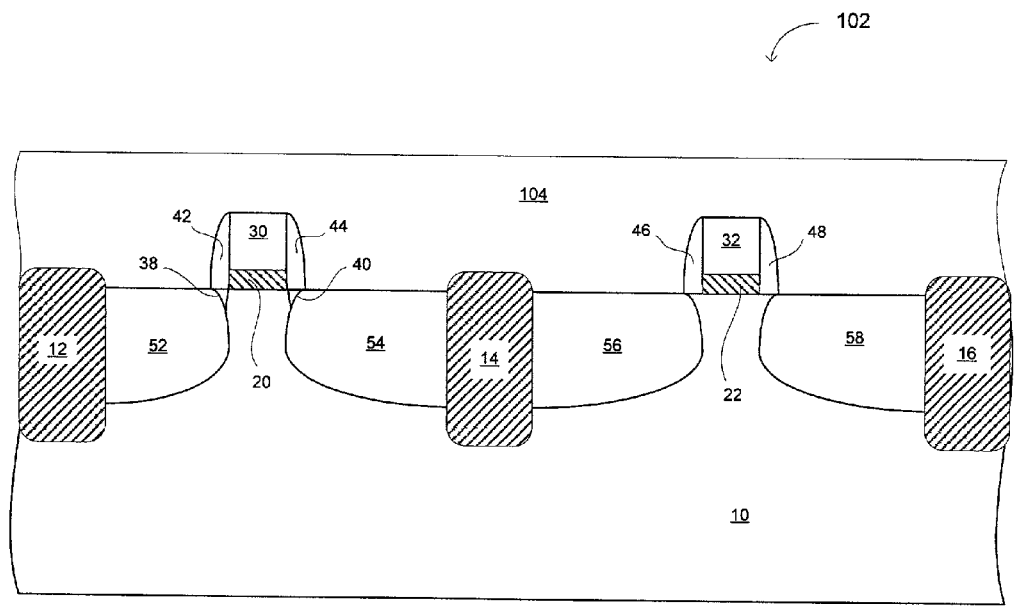

As shown in FIG. 2, a dielectric layer 104 can be deposited over the entire CMOS substrate 102. The dielectric layer 104 operates to insulate CMOS substrate 102 from the overlying features that will be subsequently formed. After deposition, dielectric layer 104 can be substantially planarized using any planarization process known in the art, e.g., chemical-mechanical polishing (CMP). In some aspects of the invention this planarization step is not needed.

At this stage, if desired, a capping structure similar to that described below can be formed. Usually, a capping structure is not needed at this location in most aspects of the invention and so is described in detail below.

Figure 3:
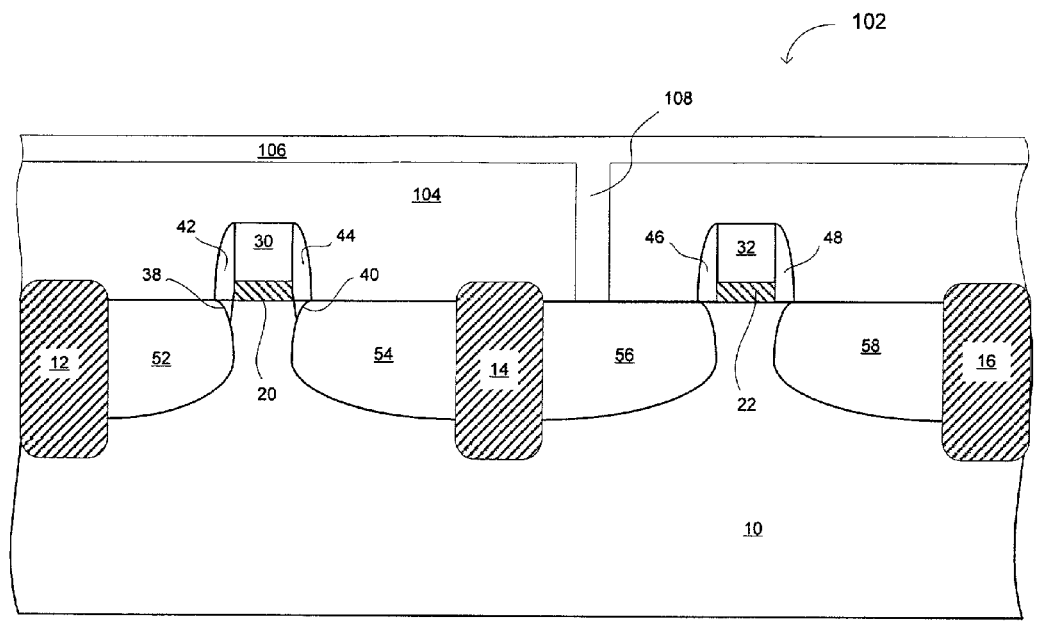

After providing the substrate, a first metallization layer 106 is formed as illustrated in FIG. 3. For metallization layer 106 to contact CMOS substrate 102, a contact 108 is first formed before forming the first metallization layer. As known in the art, contact 108 is formed through the dielectric layer 104 overlying CMOS substrate 102. The contact is formed using standard processing techniques known in the art by depositing a photoresist layer, developing the photoresist layer to expose an upper surface of the dielectric layer above the desired region of contact 108, etching the dielectric layer using the developed photoresist layer and, for example, a $C_3F_8$ and CO plasma etchant, and then stripping the photoresist layer with an $O_2$ plasma, followed by a wet chemical strip.

The first metallization layer 106 is then deposited. The first metallization layer can comprise any metal, metal alloys, or metal compounds (or combinations thereof) known in the art that—whether alone or combined—function as a metallization layer. Examples of such metals include tungsten, titanium, aluminum, copper, and refractory metals other than tungsten, as well as their alloys and compounds. The thickness of the metallization layer (or respective thicknesses of individual layers making up the metallization layer) can be any thickness known in the art that provides the desired physical and electrical characteristics needed for the metallization layer.

Figure 4:
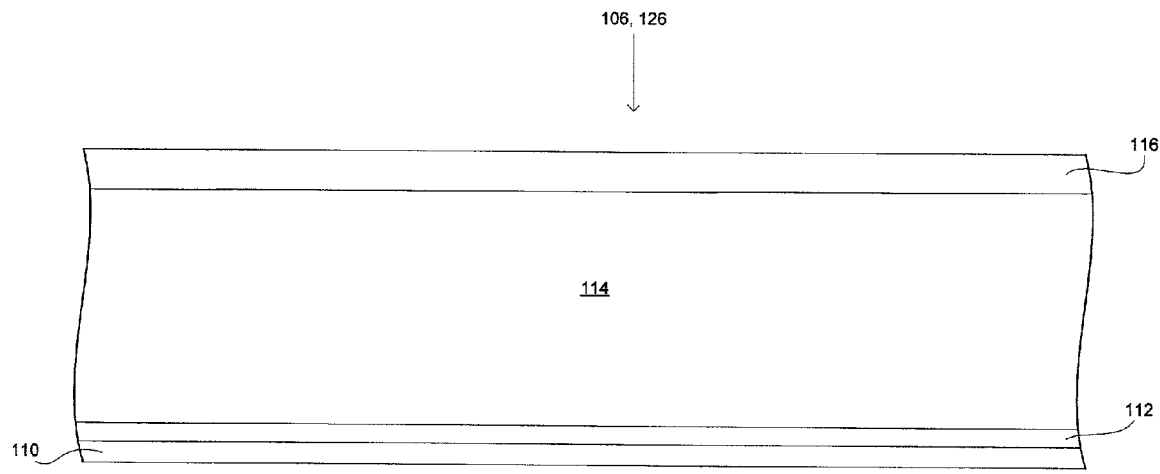

In a preferred aspect of the invention, as illustrated in FIG. 4, the first metallization layer 106 includes a combination of several layers. The first layer is a titanium (Ti) layer 110 with a thickness of about 150 Å. The second layer is a titanium nitride (TiN) layer 112 with a thickness of about 100 Å. The third layer is a W layer 114 with a thickness of about 3000 Å. The fourth and final layer of the first metallization layer 106 is a TiN layer 116 with a thickness of about 250 Å. These various layers can be deposited using any known technique in the art providing the necessary physical characteristics, such as the ability to fill contact holes 108. Examples of such known techniques include sputtering or chemical vapor deposition (CVD). As well, for the upper TiN layer, a titanium layer could be deposited and then nitrided in a nitrogen-containing atmosphere as known in the art.

Next, first metallization layer 106 is patterned to obtain the desired metal lines. Any suitable process patterning the metallization layer 106 into the metal lines can be employed in the invention. For example, one standard processing technique known in the art that can be used deposits a photoresist layer over the metallization layer, develops the photoresist layer to expose an upper surface of the metallization layer 106 to be removed, etches the metallization layer using the developed photoresist layer and, for example, a $SF_6$ and $N_2$ plasma etchant, and then strips the photoresist layer using a $NF_3$ and $O_2$ plasma, followed by a wet chemical strip.

Figure 5:
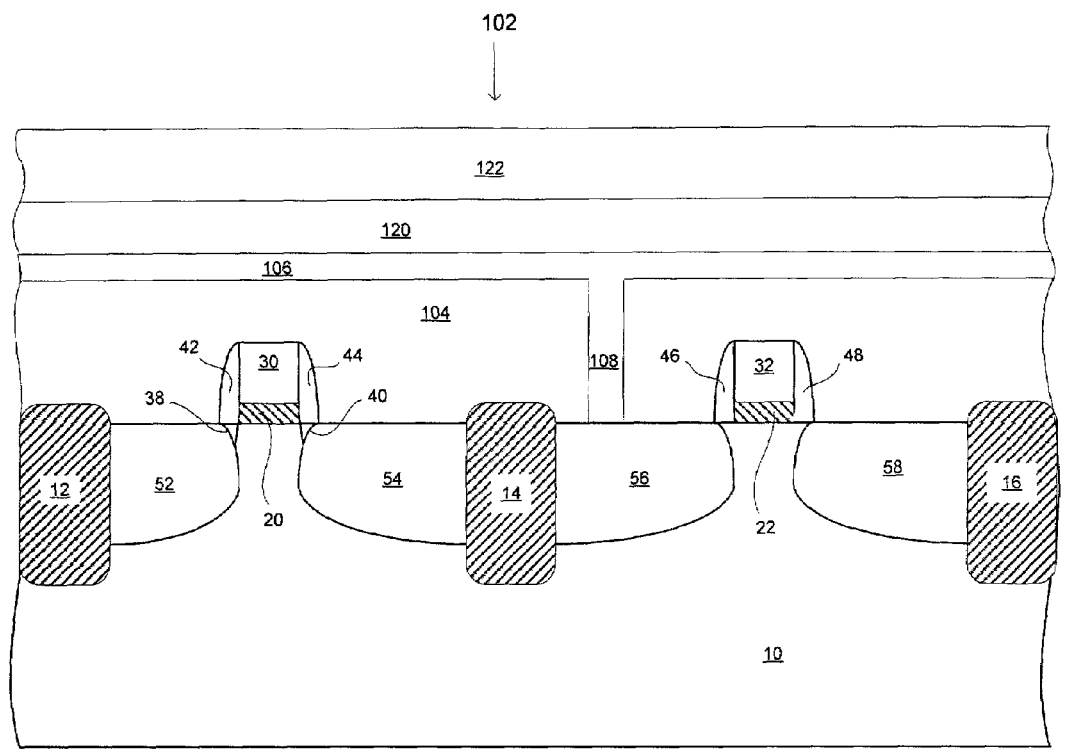

Next, as illustrated in FIG. 5, a first dielectric layer 120 (or combination of dielectric layers) is deposited over the metal lines formed from metallization layer 106. Any dielectric material known in the art can be used in first dielectric layer of the invention. Examples of dielectric materials include silicon nitride ($Si_xN_y$), silicon oxide ($SiO_2$), and low-k dielectrics such as fluorinated $SiO_2$. The thickness of the first dielectric layer 120 is any suitable thickness that will provide the desired electrical insulation characteristics. In one aspect of the invention, a high-density plasma CVD (HDP-CVD) silicon oxide layer is deposited to a thickness of about 9000 Å. The first dielectric layer 120 is then substantially planarized using any suitable process, such as CMP. In one aspect of the invention, the planarization process reduces the thickness for the HDPCVD silicon oxide layer to about 3000 Å above the upper surface of the patterned metallization layer.

After planarizing the first dielectric layer 120, a first capping structure ("first cap") is deposited over the first dielectric layer. The first cap operates to reduce or eliminate the peeling between the first metallization layer and its underlying substrate (i.e., first dielectric layer) that can occur when the first metallization layer is subjected to heat treatments.

Figure 6A:
Figure 6B:
Figure 6C:
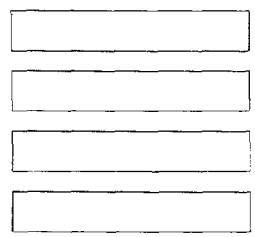
Figure 6D:
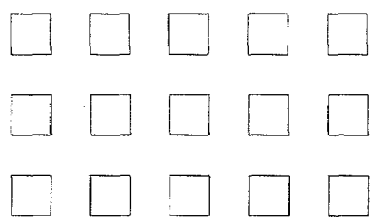

The first cap can be configured with any shape or size that will obtain the desired function. In one aspect of the invention, the first cap can be a continuous or substantially continuous layer(s) as illustrated in FIG. 6a. In another aspect of the invention, the first cap is not continuous, e.g., it may be substantially contiguous at discrete points as illustrated in FIG. 6b. Another example of the non-continuous first cap is illustrated in FIGS. 6c and 6d, where the first cap may have sections with a material and sections without a material. Non-continuous caps are not preferred in the invention because of the additional processing (and costs) required to make a non-continuous layer.

Any material that operates as a cap as described above between the underlying substrate and the overlying metallization layer can be used in first cap of the invention. Examples of cap materials include non-conducting materials—like highly-resistive semiconductor materials such as undoped amorphous Si—and dielectric materials like phosphosilicate glass (PSG), plasma-enhanced CVD (PECVD) silane oxide, PECVD TEOS oxide, APCVD or LPCVD TEOS or PSG, HDP-CVD $SiO_2$, and BPSG. In one aspect of the invention, several layers can be combined to operate as the first cap. The thickness of the cap material (or materials) need only be sufficient to provide the desired function. Generally, the thickness of the first cap can range from about 250 Å to about 10,000 Å.

In one aspect of the invention, when the first metallization layer described above is used, the first cap employed is made of the material described below and made in the following manner. First, as illustrated in FIG. 5, a PSG layer 122 is deposited to a thickness of about 2000 Å using any known technique in the art, e.g., atmospheric-pressure CVD (APCVD). The PSG layer is then annealed at a temperature and time sufficient to enhance the adhesion of the underlying metallization layer to its substrate (i.e., the first dielectric layer under the first metallization layer). In one aspect of the invention, the PSG layer is annealed for about 30 minutes in an inert or non-reactive atmosphere (e.g., nitrogen or helium) at a temperature of about 700° C. In another aspect of the invention, the annealing process can be performed in a similar atmosphere for about 60 minutes at a temperature of about 675° C. Similar temperatures, times, and atmospheres which accomplish this annealing function can be employed in the invention. For example, a rapid thermal annealing (RTA) treatment at 700° C. for 60 seconds in an argon ambient could be used. Other temperature and time combinations for RTA treatments can be used in this aspect of the invention.

Figure 7:
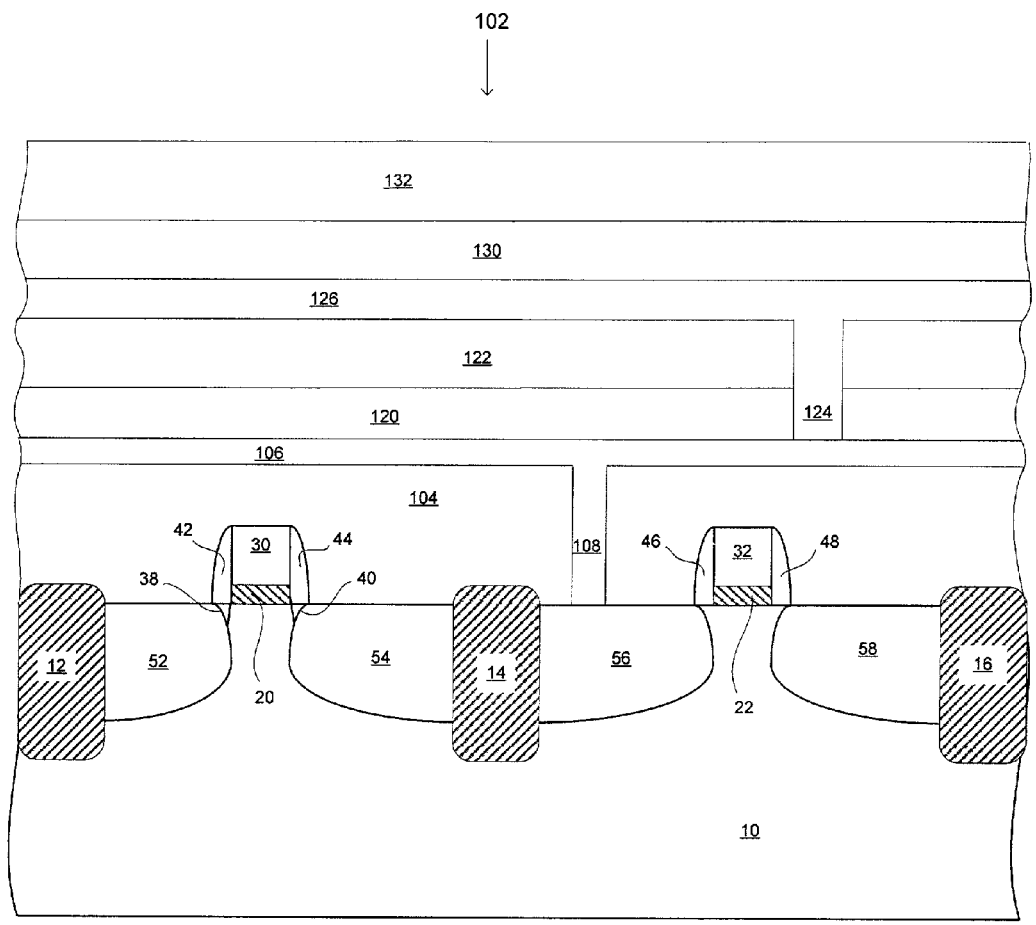

Next, as illustrated in FIG. 7, via 124 is formed in the first cap (when present) and first dielectric layer 120. The via 124 can be formed using standard processing techniques known in the art, e.g., depositing a photoresist layer, developing the photoresist layer to expose an upper surface of the desired region of via 124, etching the first cap (when present), and the first dielectric layer using the developed photoresist layer and, for example, a $C_3F_8$ and CO plasma etchant, and then stripping the photoresist layer using an $O_2$ plasma followed by a wet chemical strip.

Then, the second metallization layer 126 is deposited as illustrated in FIG. 7. The second metallization layer 126 can comprise any metal, metal alloys, or metal compounds (or combinations thereof) known in the art that—whether alone or combined—function as a metallization layer. Examples of such metals include tungsten, titanium, aluminum, copper, and their alloys and compounds. The thickness of the second metallization layer (or respective thicknesses of individual layers making up the metallization layer) can be any thickness known in the art that provides the desired characteristics needed for the metallization layer.

In a preferred aspect of the invention, the second metallization layer 126 includes a combination of several layers substantially similar to the first metallization layer. Thus, as illustrated in FIG. 4, the second metallization layer 126 contains a first titanium (Ti) layer 110 with a thickness of about 150 Å. The second layer is a titanium nitride (TiN) layer 112 with a thickness of about 100 Å. The third layer is a W layer 114 with a thickness of about 3000 Å. The fourth and final layer of the first metallization layer 106 is a TiN layer 116 with a thickness of about 250 Å. These various layers can be deposited using any known technique in the art as described above, such as sputtering or chemical vapor deposition (CVD). As well, for the upper TiN layer, a titanium layer could be deposited and then nitrided in a nitrogen-containing atmosphere as known in the art.

Then, second metallization layer 126 is patterned to obtain the desired metal lines. Any suitable process patterning the metallization layer into the metal lines can be employed in the invention. For example, one standard processing technique known in the art that can be used deposits a photoresist layer over the metallization layer, develops the photoresist layer to expose an upper surface of the metallization layer to be removed, etches the metallization layer using the developed photoresist layer and a $SF_6$ and $N_2$ plasma etchant, and then strips the photoresist layer using an $NF_3$ and $O_2$ plasma followed by a wet chemical strip.

Next, a second dielectric layer 130 (or combination of dielectric layers) is deposited over the metal lines formed from second metallization layer 126. Any dielectric material known in the art can be used in second dielectric layer of the invention. Examples of dielectric materials include silicon nitride (SiNx), silicon oxides ($SiO_2$), and low-k dielectrics such as fluorinated SiO2. The thickness of the second dielectric layer is any suitable thickness that will provide the desired electrical insulation characteristics. In one aspect of the invention, a high-density plasma CVD (HDP-CVD) silicon oxide layer is deposited to a thickness of about 9000 Å. The second dielectric layer is then substantially planarized using any suitable process, such as CMP. In one aspect of the invention, the planarization process reduces the thickness, e.g., for the HDPCVD silicon oxide layer the thickness can be decreased to about 3000 Å above the top of the second dielectric layer.

In one aspect of the invention, a second capping structure ("second cap") can be deposited over the second dielectric layer. The second cap 132 serves a similar function, can be made of a similar material, can be formed in similar configuration(s), and can be formed in a similar manner as the first cap. When used, the second cap is then followed by another annealing process similar to the annealing process used for the first cap.

Generally, the invention is able to reduce or prevent peeling of metallization layer or metal structure "n" from an adjacent (usually underlying) layer or structure. To obtain that result, a capping layer or capping structure is deposited over the inter-metal dielectric layer overlying the metal layer or metal structure. Then, an annealing step is performed—it is believed—to "pin down" the underlying metal layer/structure by enhancing the adhesion of the metal layer/structure to the underlying layer or structure.

After the above processes are concluded, conventional processing can continue to finish the IC device. For example, additional metallization (including underlying and overlying caps) and additional dielectric layers can be formed. As well, the other components to complete the CMOS device can be formed.

Having described the preferred embodiments of the present invention, it is understood that the invention defined by the appended claims is not to be limited by particular details set forth in the above description, as many apparent variations thereof are possible without departing from the spirit or scope thereof.

We claim:

1. A method for making a semiconductor device, comprising:
   providing a metal structure comprising tungsten on a substrate;
   providing an insulating layer over the metal structure;
   providing a capping structure over the insulating layer; and
   annealing the resulting structure, wherein a portion of the metal structure has a width greater than about 1 micron, wherein the capping structure and annealing prevents peeling of the metal structure when heated.

2. The method of claim 1, wherein the substrate comprises a dielectric upper surface.

3. The method of claim 1, the capping structure comprising a substantially continuous layer.

4. The method of claim 1, the capping structure comprising a dielectric material.

5. The method of claim 4, wherein the dielectric material of the capping structure is PSG.

6. The method of claim 1, including planarizing the insulating layer before providing the capping structure.

7. The method of claim 1, including annealing for about 30 to about 60 minutes at a temperature ranging from about 675 to about 700 degrees Celsius.

8. A method for making a semiconductor device, comprising:
   providing a metal structure on a substrate, the metal structure comprising tungsten and a portion of the metal structure having a width greater than about 1 micron; and
   providing an insulating layer over the metal structure;

providing a capping structure over the insulating layer; and annealing the resulting structure;

wherein the capping structure and annealing prevents peeling of the metal structure when heated.

9. A method for making a semiconductor device, comprising:

providing a metal structure on a substrate, the metal structure comprising tungsten and a portion of the metal structure having a width greater than about 1 micron; and providing an insulating layer over the metal structure;

providing a capping structure over the insulating layer; and annealing the resulting structure;

wherein the annealing prevents peeling of the metal structure when heated.

10. A method for preventing peeling of a metal structure in a semiconductor device, comprising:

providing a metal structure comprising tungsten on a substrate;

providing an insulating layer over the metal structure;

providing a capping structure over the insulating layer; and annealing the resulting structure, wherein a portion of the metal structure has a width greater than about 1 micron, and wherein the annealing prevents peeling of the metal structure when heated.

11. A method for preventing peeling of a metal structure in a semiconductor device, comprising:

providing a metal structure on a substrate, the metal structure comprising tungsten and a portion of the metal structure having a width greater than about 1 micron; and providing an insulating layer over the metal structure;

providing a capping structure over the insulating layer; and annealing the resulting structure;

wherein the annealing prevents peeling of the metal structure when heated.

12. A semiconductor device made by the method comprising:

providing a metal structure on a substrate, the metal structure comprising tungsten and a portion of the metal structure having a width greater than about 1 micron; and providing an insulating layer over the metal structure;

providing a capping structure over the insulating layer; and annealing the resulting structure;

wherein the capping structure and annealing prevents peeling of the metal structure when heated.

\* \* \* \* \*